US012593508B2

(12) United States Patent
Xu et al.

(10) Patent No.: US 12,593,508 B2
(45) Date of Patent: Mar. 31, 2026

(54) DISPLAY SUBSTRATE, DISPLAY SUBSTRATE MOTHERBOARD AND DISPLAY APPARATUS

(71) Applicants:Ordos Yuansheng Optoelectronics Co., Ltd., Ordos (CN); BOE Technology Group Co., Ltd., Beijing (CN)

(72) Inventors: Jingyi Xu, Beijing (CN); Jianyun Xie, Beijing (CN); Wei Li, Beijing (CN); Jian Sun, Beijing (CN); Zhen Wang, Beijing (CN); Yanqing Chen, Beijing (CN); Yanfeng Li, Beijing (CN); Lin Hou, Beijing (CN); Aiyu Ding, Beijing (CN); Jiantao Liu, Beijing (CN)

(73) Assignees: Ordos Yuansheng Optoelectronics Co., Ltd., Ordos (MN); BOE Technology Group Co., Ltd., Beijing (CN)

( * ) Notice: Subject to any disclaimer, the term of this patent is extended or adjusted under 35 U.S.C. 154(b) by 401 days.

(21) Appl. No.: 18/039,284

(22) PCT Filed: Dec. 28, 2021

(86) PCT No.: PCT/CN2021/142169
§ 371 (c)(1),
(2) Date: May 30, 2023

(87) PCT Pub. No.: WO2023/122981
PCT Pub. Date: Jul. 6, 2023

(65) Prior Publication Data
US 2024/0355831 A1     Oct. 24, 2024

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC ............................. H10D 86/60; H10D 86/441
See application file for complete search history.

(56) References Cited

U.S. PATENT DOCUMENTS

2009/0262094 A1    10/2009  Lin
2017/0031191 A1    2/2017   Choi et al.
(Continued)

FOREIGN PATENT DOCUMENTS

CN        106405889 A     2/2017
CN        107658294 A     2/2018
(Continued)

OTHER PUBLICATIONS

International Search Report for PCT/CN2021/142169 Mailed Sep. 29, 2022.

*Primary Examiner* — Joseph L Williams
(74) *Attorney, Agent, or Firm* — Ling and Yang Intellectual Property

(57) ABSTRACT

Disclosed are a display substrate, a display substrate motherboard and a display apparatus. The display substrate includes a display region and a bonding region located on a side of the display region, wherein the bonding region includes a fanout region, the fanout region includes a first anti-static area and a first wiring area located around the first anti-static area, the first wiring area includes a plurality of fanout wires, the first anti-static area includes at least one electrostatic protection structure disposed between the plurality of fanout wires, and the electrostatic protection structure includes at least one pair of electrostatic protection lines, and the pair of electrostatic protection lines includes (Continued)

two electrostatic protection lines disposed symmetrically about a center line extending in a first direction.

17 Claims, 6 Drawing Sheets

(56)                    References Cited

U.S. PATENT DOCUMENTS

| | | | |
|---|---|---|---|
| 2021/0335978 A1 | 10/2021 | Cheng et al. | |
| 2021/0405420 A1 | 12/2021 | Hu | |
| 2023/0165091 A1 * | 5/2023 | Xu ..................... | H10K 59/1213 257/91 |
| 2024/0243136 A1 * | 7/2024 | Chu ....................... | H10D 86/60 |

FOREIGN PATENT DOCUMENTS

| | | | |
|---|---|---|---|
| CN | 107785350 A | 3/2018 |
| CN | 109377874 A | 2/2019 |
| CN | 109801909 A | 5/2019 |
| CN | 110473464 A | 11/2019 |
| CN | 112684932 A | 4/2021 |
| CN | 113204145 A | 8/2021 |
| CN | 214098387 U | 8/2021 |
| KR | 10-2015-0047948 A | 5/2015 |

* cited by examiner

DISPLAY SUBSTRATE, DISPLAY SUBSTRATE MOTHERBOARD AND DISPLAY APPARATUS

CROSS-REFERENCE TO RELATED APPLICATION

The present application is a U.S. National Phase Entry of International Application No. PCT/CN2021/142169 having an international filing date of Dec. 28, 2021, the entire content of which is hereby incorporated by reference.

TECHNICAL FIELD

Embodiments of present disclosure relate to, but are not limited to, the field of display technologies, and particularly to a display substrate, a display substrate motherboard, and a display apparatus.

BACKGROUND

A manufacturing process of display products is usually carried out in a strong electric environment or a strong magnetic environment, which is prone to Electro Static Discharge (ESD for short), and the ESD produces an extremely high current, which easily destroys or damages devices or circuits in the display products, resulting in a reduced product yield.

SUMMARY

The following is a summary of subject matters described herein in detail. The summary is not intended to limit the protection scope of claims.

In a first aspect, a display substrate is provided in an embodiment of the present disclosure, which includes a display region and a bonding region located on a side of the display region, wherein the bonding region includes a fanout region, the fanout region includes a first anti-static area and a first wiring area located around the first anti-static area, the first wiring area includes a plurality of fanout wires, the first anti-static area includes at least one electrostatic protection structure disposed between the plurality of fanout wires, and the electrostatic protection structure includes at least one pair of electrostatic protection lines, and the pair of electrostatic protection lines includes two electrostatic protection lines disposed symmetrically about a center line extending in a first direction.

In a second aspect, a display substrate motherboard is also provided in an embodiment of the present disclosure, which includes a substrate, wherein the substrate includes a display substrate region and a non-display substrate region, wherein the display substrate region includes a plurality of display substrates, and at least one of the plurality of display substrates is the display substrate described in the above embodiment.

In a third aspect, a display apparatus is also provided in an embodiment of the disclosure, wherein the display apparatus includes the display substrate as described in the above embodiment.

Other characteristics and advantages of the present disclosure will be set forth in the following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure. Shapes and sizes of each component in the drawings do not reflect actual scales, but are only intended to schematically illustrate contents of the present disclosure.

DETAILED DESCRIPTION

Figure 1:
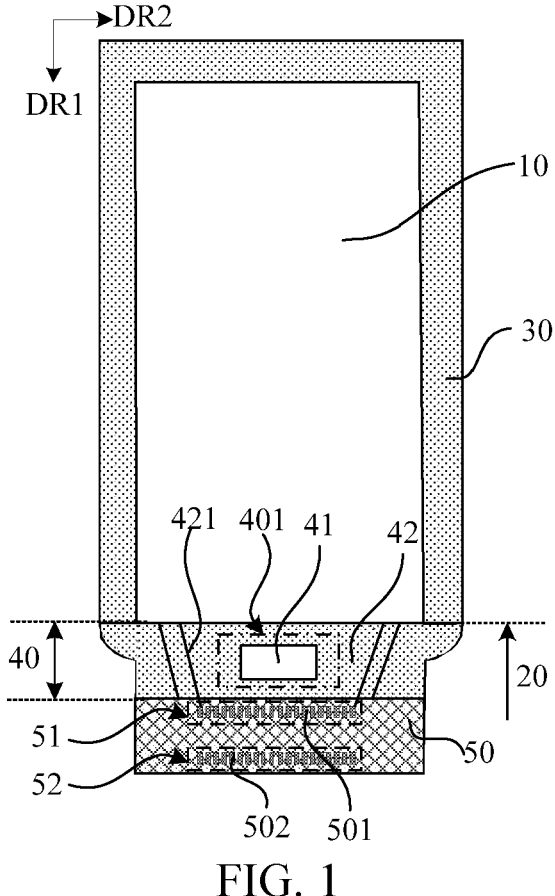
FIG. 1 is a schematic diagram of a first structure of a display substrate in an exemplary embodiment of the present disclosure.

Many embodiments are described herein, but the description is exemplary rather than restrictive, and there may be more embodiments and implementation solutions within the scope contained in the embodiments described herein. Although many possible feature combinations are shown in the drawings and discussed in exemplary implementations, many other combinations of the disclosed features are possible. Unless expressly limited, any feature or element of any embodiment may be used in combination with, or may replace, any other feature or element in any other embodiment.

When a representative embodiment is described, a method or process may have already been presented in a specific sequence of acts in the specification. However, to an extent that the method or process does not depend on a specific sequence of the acts herein, the method or process should not be limited to the acts in the specific sequence. As will be understood by those of ordinary skill in the art, other act orders are possible. Therefore, the specific order of the acts illustrated in the specification should not be interpreted as a limitation on claims. In addition, the claims with respect to the method or process should not be limited to executing the acts according to the written order. Those skilled in the art may easily understand that these sequences may change, and are still maintained in the spirit and scope of the embodiments of the disclosure.

In the drawings, a dimension of each constituent element, a thickness of a layer, or an area is exaggerated sometimes for clarity. Therefore, an implementation of the present disclosure is not necessarily limited to the size shown, and a shape and size of each component in the drawings do not reflect true proportions. In addition, the drawings schematically illustrate ideal examples, and an implementation of the present disclosure is not limited to shapes, numerical values, or the like shown in the drawings.

The "first", "second", "third" and other ordinal numbers in the exemplary embodiments of the present disclosure are used to avoid confusion of constituent elements, but not to provide any quantitative limitation.

In the exemplary embodiments of the present disclosure, for the sake of convenience, wordings such as "central", "upper", "lower", "front", "rear", "vertical", "horizontal", "top", "bottom", "inner", "outer" and the others describing the orientations or positional relations are used to depict the relationship of constituent elements with reference to the drawings, which are only for an easy and simplified description of the present disclosure, rather than for indicating or implying that the device or element referred to must have a specific orientation, or must be constructed and operated in a particular orientation, and therefore, those wordings cannot be construed as limitations on the present disclosure. The positional relationships between the constituent elements may be changed as appropriate according to a direction which is used for describing each constituent element. Therefore, appropriate replacements may be made according to situations without being limited to the wordings described in the specification.

In the exemplary embodiments of the present disclosure, the terms "install", "connect" and "couple" shall be broadly understood unless otherwise explicitly specified and defined. For example, it may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure depending on situations.

In the exemplary embodiments of the present disclosure, "an electrical connection" includes a case where constituent elements are connected via an element having a certain electrical effect. The "element with a certain electrical effect" is not particularly limited as long as electrical signals may be sent and received between the connected constituent elements. For example, "the element with a certain electrical effect" may be an electrode or wiring, or a switch element, such as a transistor, or other functional elements, such as a resistor, an inductor, a capacitor, or the like.

In the exemplary embodiments of the present disclosure, a transistor refers to an element that at least includes three terminals, i.e., a gate electrode (a gate or a control electrode), a drain electrode (a drain electrode terminal, a drain region, or a drain), and a source electrode (a source electrode terminal, a source region, or a source). A transistor has a channel region between a drain electrode and a source electrode, and a current can flow through the drain electrode, the channel region, and the source electrode. It is to be noted that, in the specification, the channel region refers to a region through which the current mainly flows.

In the exemplary embodiments of the present disclosure, in order to distinguish two electrodes of a transistor other than a gate electrode (a gate or a control electrode), one of the two electrodes is directly described as a first electrode, while the other is described as a second electrode. The first electrode may be a drain electrode, and the second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In an exemplary embodiment of the present disclosure, a transistor may be a Thin Film Transistor (TFT) or a Field Effect Transistor (FET) or other device with a same characteristic.

In an exemplary embodiment of the present disclosure, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the exemplary embodiments of the present disclosure, "about" means that there is not strict limit for a value, and values within an error range during processes and measurement are allowed.

In an exemplary embodiment of the present disclosure, a first direction DR1 may refer to a column direction or an extending direction of a data signal line in the display region, and a second direction DR2 may refer to a row direction or an extending direction of a scanning signal line in the display region, and a third direction DR3 may be a direction perpendicular to a plane of a display substrate, or a thickness direction of the display substrate or the like. Herein, the first direction DR1 intersects with the second direction DR2, and the first direction DR1 intersects with the third direction DR3. For example, the first direction DR1 and the second direction DR2 may be perpendicular to each other, and the first direction DR1 and the third direction DR3 may be perpendicular to each other.

In a manufacturing process of display substrates, Electro Static Discharge (ESD for short) is easy to occur. Since ESD may cause an extremely high current, components in a circuit are easy to be broken down or signal lines in the circuit are easy to be destroyed, resulting in damage to effective devices and low product yield.

A display substrate is provided in an embodiment of the present disclosure, which may include a display region and a bonding region located on a side of the display region, wherein the bonding region may include a fanout region, the fanout region may include a first anti-static area and a first wiring area located around the first anti-static area, the first wiring area may include a plurality of fanout wires, the first anti-static area may include at least one electrostatic protection structure disposed between the plurality of fanout wires, and the electrostatic protection structure may include at least one pair of electrostatic protection lines, and the pair of electrostatic protection lines may include two electrostatic protection lines disposed symmetrically about a center line extending in a first direction.

The electrostatic protection structure is configured to eliminate electrostatic charges, thereby preventing the display substrate from electrostatic damage.

In an exemplary embodiment, electrostatic protection lines may be made of metal lines.

Here, the center line may refer to a straight line extending in the first direction that divides the electrostatic protection structure equally, or may refer to a straight line extending in the first direction that divides, equally, the anti-static area where the electrostatic protection structure is located. Here, no limitation is made thereto in embodiments of the present disclosure.

Thus, in the display substrate provided in the embodiments of the present disclosure, by disposing an electrostatic protection structure in the fanout region, when ESD occurs in the display substrate, since the electrostatic protection structure acts as a conductor, most of the electrostatic charges flowing into the fanout region can be conducted into the electrostatic protection structure. Therefore, electrostatic charges flowing into components (such as transistors) or conductive lines in the display substrate can be avoided, thus effectively protecting components (such as transistors) or conductive lines in the display substrate and avoiding ESD damage. Furthermore, the product yield can be improved. Because the electrostatic protection structure is achieved by electrostatic protection lines disposed symmetrically, in a manufacturing process of the display substrate, it is unnecessary to add an extra mask process, change a film thickness, and add other procedure, and productivity reduction can be avoided.

In an exemplary embodiment, an orthographic projection of the electrostatic protection structure on a plane of the display substrate and orthographic projections of the plurality of fanout wires on the plane of the display substrate are disposed at intervals.

In an exemplary embodiment, an interval distance between two electrostatic protection lines of the pair of electrostatic protection lines is less than 10 microns. For example, the interval distance between two electrostatic protection lines can be 9 microns, 8 microns, 7 microns, 6 microns, 5 microns, 4 microns, 3 microns, 2 microns, or 1 micron, etc. Here, no limitation is made thereto in embodiments of the present disclosure.

In an exemplary embodiment, at least one pair of electrostatic protection lines may include at least one of a first pair of electrostatic protection lines and a second pair of electrostatic protection lines, wherein the first pair of electrostatic protection lines may include two L-shaped first electrostatic protection lines disposed symmetrically about the center line and the second pair of electrostatic protection lines may include two line-shaped second electrostatic protection lines disposed symmetrically about the center line.

In an exemplary embodiment, the first electrostatic protection line may include a first sub-line extending in a first direction and a second sub-line extending in a second direction which are connected sequentially, there is a preset included angle between the second sub-line and the first sub-line, the preset included angle ranges from 80° to 100°, and the second direction intersects with the first direction.

In an exemplary embodiment, a ratio between a length of the second sub-line and a length of the first sub-line is greater than or equal to 100, wherein the length of the second sub-line refers to a dimensional feature in the second direction, and the length of the first sub-line refers to a dimensional feature in the first direction.

In an exemplary embodiment, a width of the second sub-line is equal to a width of the first sub-line, wherein the width of the second sub-line refers to a dimensional feature in the first direction, and the width of the first sub-line refers to a dimensional feature in the second direction.

In an exemplary embodiment, the second sub-line includes a first portion and a second portion that satisfy one or more of the following conditions: a material of the first portion is different from a material of the second portion, and a width of the first portion is different from a width of the second portion, wherein the width of the first portion and the width of the second portion refer to dimensional features in the first direction.

In an exemplary embodiment, the second sub-line may be a straight line or a curved line. For example, the curved line may be, but is not limited to, a serrated line or a wavy line. Here, no limitation is made thereto in embodiments of the present disclosure.

In an exemplary embodiment, the bonding region may further include a chip region located on a side of the fanout region in the first direction, wherein the chip region includes a first pin area and a second pin area sequentially disposed along the first direction, the first pin area includes a plurality of signal output pins sequentially disposed along the second direction, the second pin area includes a plurality of signal input pins sequentially disposed along the second direction, and ends of at least part of the plurality of fanout wires away from the display region are connected to the plurality of signal output pins.

In an exemplary embodiment, the display substrate may include a bezel region located on other sides of the display region, wherein the bezel region includes a second wiring area and a second anti-static area located on a side of the second wiring area away from the display region, the second wiring area includes a ground wire disposed on a periphery of the display region, and the second anti-static area includes at least one of the electrostatic protection structures disposed on a side of the ground wire away from the display region. In this way, ESD protection can be carried out in a plurality of regions of the display substrate, thereby optimizing ESD-resistance capacity of products, reducing ESD risks caused by manufacturing processes, improving the product yield and reducing the electrostatic control requirements of the display substrate.

In an exemplary embodiment, the display substrate may be a Thin Film Transistor (TFT for short) substrate. For example, the thin film transistor may include, but is not limited to, an oxide transistor (Oxide TFT), a Low Temperature Poly-silicon TFT (LTPS TFT for short), or an amorphous silicon (A-SI for short) thin film transistor, or the like. Here, no limitation is made thereto in embodiments of the present disclosure.

In an exemplary embodiment, the display substrate may be a Liquid Crystal Display (LCD for short) substrate, an Organic Light Emitting Diode (OLED for short) substrate, or a Quantum-dot Light Emitting Diodes (QLED for short) substrate, etc. Here, no limitation is made thereto in embodiments of the present disclosure.

The display substrate and the electrostatic protection structure in the embodiments of the present disclosure will be described below with reference to the accompanying drawings.

Figure 2:
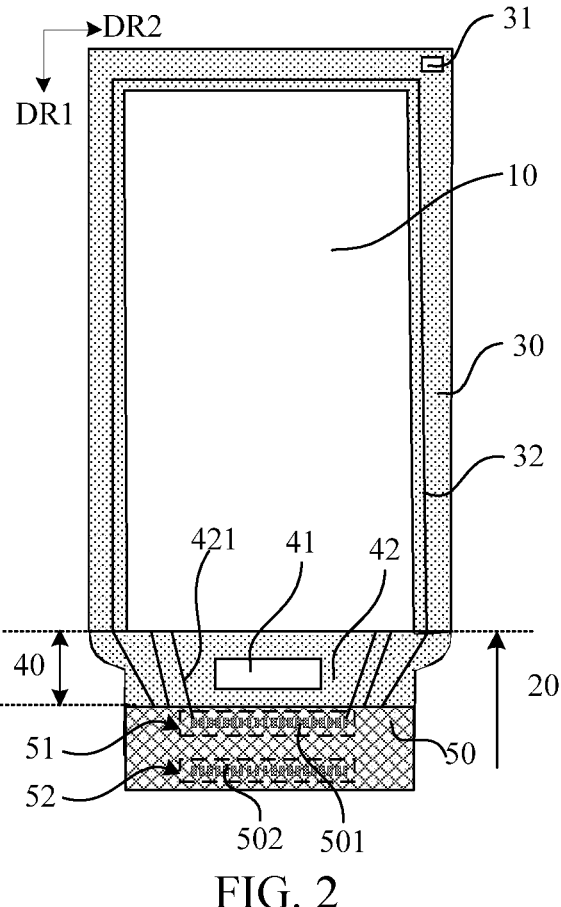
FIG. 2 is a schematic diagram of a second structure of a display substrate in an exemplary embodiment of the present disclosure.

FIG. 1 is a schematic diagram of a first structure of a display substrate in an exemplary embodiment of the present disclosure, and FIG. 2 is a schematic diagram of a second structure of a display substrate in an exemplary embodiment of the present disclosure. FIG. 1 is illustrated by an example of an electrostatic protection structure disposed in one region of the display substrate, and FIG. 2 is illustrated by an example of an electrostatic protection structure disposed in two regions of the display substrate.

In an exemplary embodiment, as shown in FIG. 1, the display substrate may include a display region 10, a bonding region 20 located on a side of the display region 10, and a bezel region 30 located on other sides of the display region 10. The bonding region 20 may include a fanout region 40 which may include a first anti-static area 41 and a wiring area 42 located around the first anti-static area 41. The wiring area 42 may include a plurality of fanout wires 421. The first anti-static area 41 may include at least one electrostatic protection structure disposed between the plurality of fanout wires 421. The electrostatic protection structure may include at least one pair of electrostatic protection lines which may include two electrostatic protection lines disposed symmetrically about a center line CL (not shown) extending in a first direction DR1.

In an exemplary embodiment, as shown in FIG. 1, an orthographic projection of the electrostatic protection structure in the first anti-static area 41 on a plane of the display substrate and orthographic projections of the fanout wires 421 on the plane of the display substrate are disposed at intervals. That is, the electrostatic protection structure is not overlapped with the fanout wires 421. Therefore, electrostatic charges are discharged at the electrostatic protection structure, which can effectively avoid damage to the fanout wires 421 and devices connected to the fanout wires 421, thereby improving the product yield.

In an exemplary embodiment, as shown in FIG. 2, the display substrate may include a display region 10, a bonding region 20 located on a side of the display region 10, and a bezel region 30 located on other sides of the display region 10. The bonding region 20 may include a fanout region 40 which may include a first anti-static area 41 and a wiring area 42 located around the first anti-static area 41. The wiring area 42 may include a plurality of fanout wires 421, and the first anti-static area 41 may include at least one electrostatic protection structure disposed between the plurality of fanout wires 421. The bezel region 30 may include a ground wire 32 and a second anti-static area 31, wherein the ground wire 32 is disposed on a periphery of the display region 10, and the second anti-static area 31 may include at least one electrostatic protection structure. The second anti-static area 31 is disposed on a side of the ground wire 32 away from the display region 10. For example, the second anti-static area 31 is located in an upper right corner region of the display substrate. The electrostatic protection structure may include at least one pair of electrostatic protection lines, and the pair of the electrostatic protection lines may include two electrostatic protection lines arranged symmetrically about a center line CL (not shown) extending in a first direction DR1.

In an exemplary embodiment, as shown in FIG. 2, an orthographic projection of the electrostatic protection structure in the second anti-static area 31 on a plane of the display substrate and an orthographic projection of the ground wire 32 on the plane of the display substrate are disposed at intervals. That is, the electrostatic protection structure is not overlapped with the ground wire 32. Therefore, electrostatic charges are discharged in the electrostatic protection structure, which can effectively avoid damage to the ground wire 32 and devices connected to the ground wire 32, thereby improving the product yield.

In an exemplary embodiment, the display region may include a plurality of sub-pixels arranged regularly, which may include a light-emitting device and a pixel drive circuit for driving the light-emitting device. The bezel region may include a gate drive circuit and a second power supply line VSS that transmits voltage signals to the plurality of sub-pixels.

In an exemplary embodiment, as shown in FIGS. 1 and 2, the bonding region 20 may further include a chip region 50 located on a side of the fanout region 40 along the first direction DR1. The chip region 50 may include a first pin area 51 and a second pin area 52 sequentially disposed along the first direction DR1, wherein the first pin area 51 may include a plurality of signal output pins 501 sequentially disposed along a second direction DR2, and the second pin area 52 may include a plurality of signal input pins 502 sequentially disposed along the second direction DR2. For example, ends of at least part of the plurality of fanout wires 421 away from the display region 10 are connected to the plurality of signal output pins 501.

In an exemplary embodiment, an external Flexible Printed Circuit (FPC for short) can be bonded and connected to the second pin area. For example, a pad including a plurality of signal input pins may be disposed in the second pin area, and the flexible printed circuit can be bonded to the pad.

In an exemplary embodiment, the chip region 50 may further include an Integrated Circuit (IC for short) Bonded and connected to the chip region. The integrated circuit may generate a driving signal needed for driving the sub-pixels and may supply the driving signal to the sub-pixels in the display region. For example, the drive signal may be a data signal that drives a luminance of the sub-pixels. For example, the integrated circuit may be bonded and connected to the chip region by an anisotropic conductive film or other means. For example, a width of the integrated circuit in the second direction DR2 may be less than a width of the chip region 50 in the second direction DR2, the second direction DR2 intersects with the first direction DR1.

In an exemplary embodiment, as shown in FIGS. 1 and 2, at least part of the plurality of fanout wires 421 are configured to connect to signal lines (for example, a data signal line and the like) in the display region 10 in a fanout wiring manner. As shown in FIG. 2, at least part of the plurality of fanout wires 421 are configured to connect to signal lines (for example, a ground wire 32 and the like) in the bezel region 30 in the fanout wiring manner. Here, no limitation is made thereto in embodiments of the present disclosure.

Figure 3A:
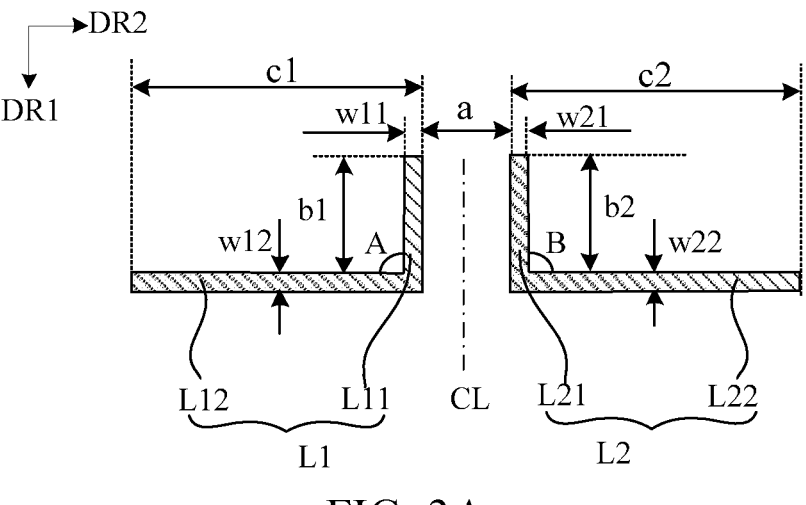
FIG. 3A illustrates schematically a first structure of a first pair of electrostatic protection lines in an exemplary embodiment of the present disclosure.
Figure 3B:
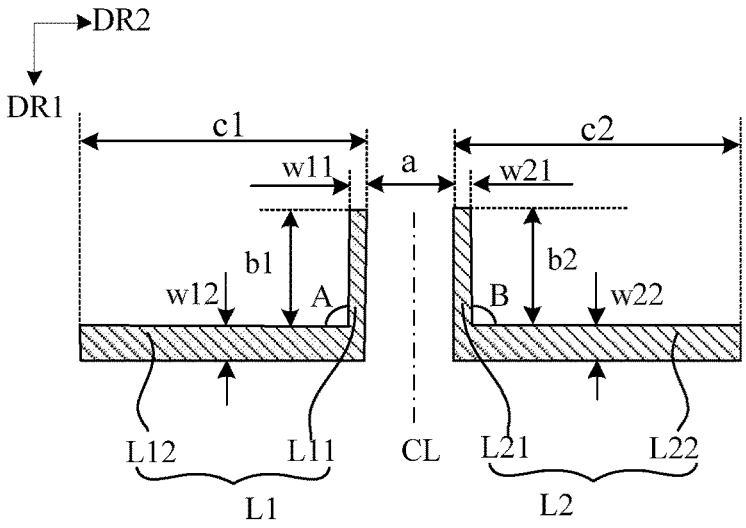
FIG. 3B illustrates schematically a second structure of the first pair of electrostatic protection lines in an exemplary embodiment of the present disclosure.
Figure 3C:
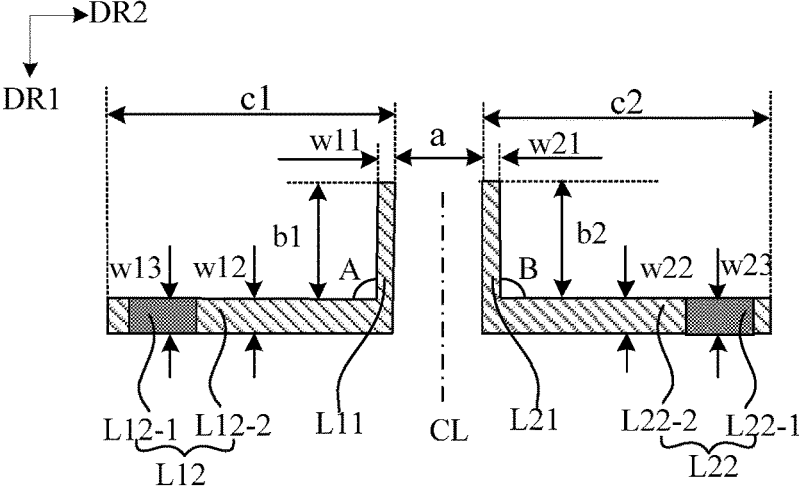
FIG. 3C illustrates schematically a third structure of the first pair of electrostatic protection lines in an exemplary embodiment of the present disclosure.
Figure 3D:
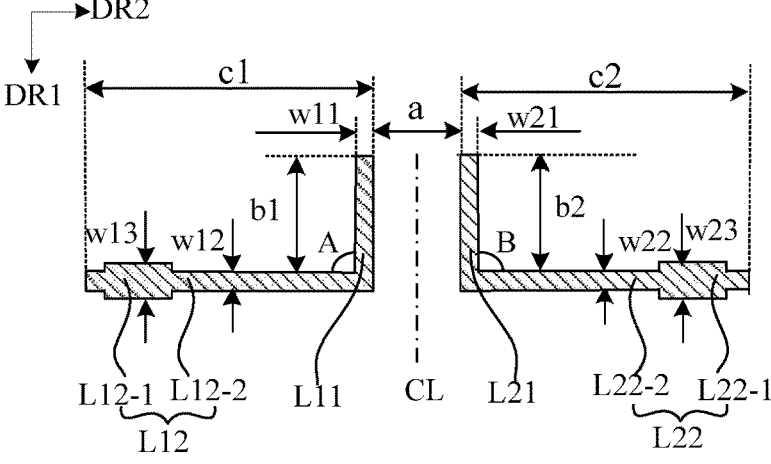
FIG. 3D illustrates schematically a fourth structure of the first pair of electrostatic protection lines in an exemplary embodiment of the present disclosure.
Figure 3E:
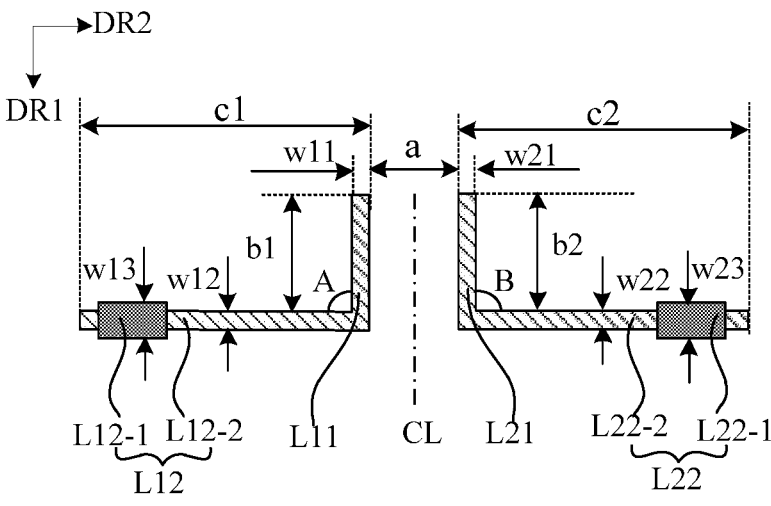
FIG. 3E illustrates schematically a fifth structure of the first pair of electrostatic protection lines in an exemplary embodiment of the present disclosure.
Figure 3F:
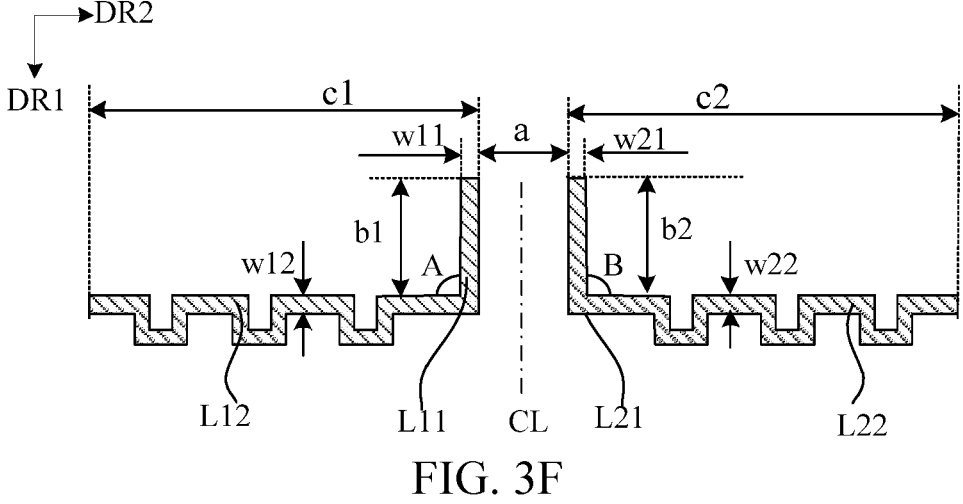
FIG. 3F illustrates schematically a sixth structure of the first pair of electrostatic protection lines in an exemplary embodiment of the present disclosure.

FIG. 3A illustrates schematically a first structure of a first pair of electrostatic protection lines in an exemplary embodiment of the present disclosure, FIG. 3B illustrates schematically a second structure of the first pair of electrostatic protection lines in an exemplary embodiment of the present disclosure, FIG. 3C illustrates schematically a third structure of the first pair of electrostatic protection lines in an exemplary embodiment of the present disclosure, FIG. 3D illustrates schematically a fourth structure of the first pair of electrostatic protection lines in an exemplary embodiment of the present disclosure, FIG. 3E illustrates schematically a fifth structure of the first pair of electrostatic protection lines in an exemplary embodiment of the present disclosure, and FIG. 3F illustrates schematically a sixth structure of the first pair of electrostatic protection lines in an exemplary embodiment of the present disclosure. Herein, FIGS. 3A to 3F illustrate schematically an electrostatic protection structure including one first pair of electrostatic protection lines as an example.

In an exemplary embodiment, as shown in FIGS. 3A to 3F, the electrostatic protection structure may include an L-shaped first line L1 and an L-shaped second line L2. The first line L1 and the second line L2 may be disposed symmetrically about a center line CL, in this manner, the first line L1 acts as a first electrostatic protection line and the second line L2 acts as another first electrostatic protection line, forming a first pair of electrostatic protection line (L1, L2).

In an exemplary embodiment, as shown in FIGS. 3A to 3F, the first line L1 may include a first line segment L11 extending in a first direction DR1 and a second line segment L12 extending in a second direction DR2 which are connected sequentially. There is a first included angle A between the first line segment L11 and the second line segment L12. The first line segment L11 may act as a first sub-line in a first electrostatic protection line, and the second line segment L12 may act as a second sub-line in the first electrostatic protection line.

In an exemplary embodiment, as shown in FIGS. 3A to 3F, the second line L2 may include a third line segment L21 extending in the first direction DR1 and a fourth line segment L22 extending in the second direction DR2 which are connected sequentially. There is a second included angle B between the third line segment L21 and the fourth line segment L22. The third line segment L21 may act as a first sub-line in another first electrostatic protection line, and the fourth line segment L22 may act as a second sub-line in the another first electrostatic protection line.

In an exemplary embodiment, the first included angle A may range from about 80° to 100°. For example, the first included angle A may be about 80°, 85°, 90°, 95°, 100°, or the like. Here, no limitation is made thereto in embodiments of the present disclosure.

In an exemplary embodiment, the second included angle B may range from about 80° to 100°. For example, the second included angle B may be about 80°, 85°, 90°, 95°, 100°, or the like. Here, no limitation is made thereto in embodiments of the present disclosure.

In an exemplary embodiment, the first included angle A is equal to the second included angle B. For example, both the first included angle A and the second included angle B can be set to be about 90°.

In an exemplary embodiment, as shown in FIGS. 3A to 3F, an interval distance between the first line segment L11 and the third line segment L21 is a preset distance a, an interval distance between the second line segment L12 and the fourth line segment L22 is the preset distance a, that is, an interval distance between the first line L1 and the second line L2 is the preset distance a. For example, the preset distance a is less than 10 microns. For example, the preset distance a can be 9 microns, 8 microns, 7 microns, 6 microns, 5 microns, 4 microns, 3 microns, 2 microns, or 1 micron, etc. Here, no limitation is made thereto in embodiments of the present disclosure.

In an exemplary embodiment, as shown in FIGS. 3A to 3F, a ratio between a length c1 of the second line segment L12 and a length b1 of the first line segment L11 is greater than or equal to 100, and a ratio between a length c2 of the fourth line segment L22 and a length b2 of the third line segment L21 is greater than or equal to 100. The length c1 of the second line segment L12 and the length c2 of the fourth line segment L22 refer to dimensional features along the second direction DR2, and the length b1 of the first line segment L11 and the length b2 of the third line segment L21 refer to dimensional features along the first direction DR1.

In an exemplary embodiment, as shown in FIGS. 3A and 3F, a width w12 of the second line segment L12 is equal to a width w11 of the first line segment L11, and a width w22 of the fourth line segment L22 is equal to a width w21 of the third line segment L21. Alternatively, as shown in FIGS. 3B and 3C, a width w12 of the second line segment L12 is not equal to a width w11 of the first line segment L11, and a width w22 of the fourth line segment L22 is not equal to a width w21 of the third line segment L21. Therefore, a resistance of the second line segment L12 is different from a resistance of the first line segment L11, and a resistance of the fourth line segment L22 is different from a resistance of the third line segment L21, so that capabilities for electrostatic attraction are different. For example, the width w12 of the second line segment L12 is greater than the width w11 of the first line segment L11, and the width w22 of the fourth line segment L22 is greater than the width w21 of the third line segment L21. The width w12 of the second line segment L12 and the width w22 of the fourth line segment L22 refer to the dimensional features along the first direction DR1, and the width w11 of the first line segment L11 and the width w21 of the third line segment L21 refer to the dimensional features along the second direction DR2.

In an exemplary embodiment, as shown in FIGS. 3C and 3E, the second line segment L12 may include a first sub-line segment L12-1 and a second sub-line segment L12-2, wherein the first sub-line segment L12-1 may act as a first portion of a second sub-line in a first electrostatic protection line, and the second sub-line segment L12-2 may act as a second portion of the second sub-line in the first electrostatic protection line. For example, as shown in the FIG. 3C, the first sub-line segment L12-1 is made of a metal material different from a metal material of which the second sub-line segment L12-2 is made. Therefore, a resistance of the first sub-line segment L12-1 is different from a resistance of the second sub-line segment L12-2, so that capabilities for electrostatic attraction are different. Different materials are represented with different patterns in FIG. 3C. For example, as shown in FIG. 3D, a width w13 of a first sub-line segment L12-1 is not equal to a width w12 of a second sub-line segment L12-2. Therefore, a capacitance of the first sub-line segment L12-1 is different from a capacitance of the second sub-line segment L12-2, so that capabilities for electrostatic attraction are different. For example, as shown in FIG. 3E, the first sub-line segment L12-1 is made of a metal material different from a metal material of which the second sub-line segment L12-2 is made, and the width w13 of the first sub-line segment L12-1 is not equal to the width w12 of the second sub-line segment L12-2.

In an exemplary embodiment, as shown in FIGS. 3C and 3E, the second line segment L22 may include a third sub-line segment L22-1 and a fourth sub-line segment L22-2, wherein the third sub-line segment L22-1 may act as a first portion of a second sub-line in another first electrostatic protection line, and the fourth sub-line segment L22-2 may act as a second portion of the second sub-line in the another first electrostatic protection line. For example, as shown in the FIG. 3C, the third sub-line segment L22-1 is made of a metal material different from a metal material of which the fourth sub-line segment L22-2 is made. Therefore, a resistance of the third sub-line segment L22-1 is different from a resistance of the fourth sub-line segment L22-2, so that capabilities for electrostatic attraction are different. Different materials are represented with different patterns in FIG. 3C. For example, as shown in FIG. 3D, a width w23 of a third sub-line segment L22-1 is not equal to a width w22 of a fourth sub-line segment L22-2. Therefore, a capacitance of the third sub-line segment L22-1 is different from a capacitance of the fourth sub-line segment L22-2, so that capabilities for electrostatic attraction are different. For example, as shown in FIG. 3E, the third sub-line segment L22-1 is made of a metal material different from a metal material of which the fourth sub-line segment L22-2 is made, and the width w23 of the third sub-line segment L12-1 is not equal to the width w22 of the fourth sub-line segment L22-2.

In an exemplary embodiment, as shown in FIGS. 3A to 3E, the second line segment L12 and the fourth line segment L22 are straight lines. Alternatively, as shown in FIG. 3F, the second line segment L12 and the fourth line segment L22 are curved lines. For example, the curved lines may be serrated or wavy. In this way, the curved wiring can form a longer wiring distance in a condition of insufficient space, thus achieving a better electrostatic attraction effect. The second line segment L12 and the fourth line segment L22 in FIG. 3F, shown as serrated lines, are taken as an example.

Figure 4:
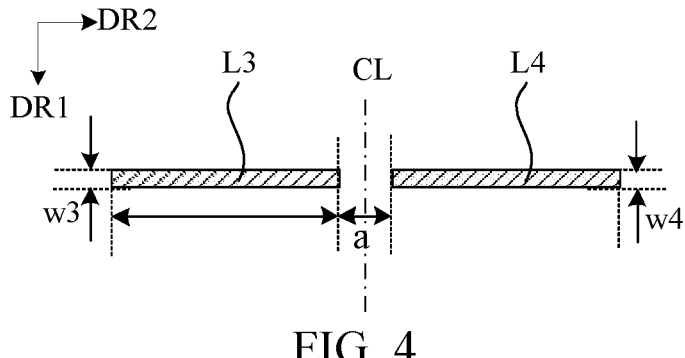
FIG. 4 illustrates schematically a structure of a second pair of electrostatic protection lines in an exemplary embodiment of the present disclosure.

FIG. 4 illustrates schematically a structure of a second pair of electrostatic protection lines in an exemplary embodiment of the present disclosure. In an exemplary embodiment, as shown in FIG. 4, an electrostatic protection structure may include a linear third line L3 and a linear fourth line L4, wherein the third line L3 and the fourth line L4 are disposed symmetrically about the center line CL. Therefore, a second pair of electrostatic protection lines (L3, L4) can be formed, where the third line L3 acts as a second electrostatic protection line and the fourth line L4 acts as another second electrostatic protection line. Herein, FIG. 4 illustrates schematically an electrostatic protection structure including one second pair of electrostatic protection lines as an example.

In an exemplary embodiment, as shown in FIG. 4, an interval distance between the third line L3 and the fourth line L4 is a preset distance a. For example, the preset distance a is less than 10 microns. For example, the preset distance a can be 9 microns, 8 microns, 7 microns, 6 microns, 5 microns, 4 microns, 3 microns, 2 microns, or 1 micron, etc. Here, no limitation is made thereto in embodiments of the present disclosure.

In an exemplary embodiment, as shown in FIG. 4, a width w3 of the third line L3 and a width w4 of the fourth line L4 may be equal. The width w3 of the third line L3 and the width w4 of the fourth line L4 refer to dimensional features along a first direction DR1.

Furthermore, with reference to the above description of the width w12 of the second line segment L12 and the fourth line segment L22, other characteristics of the third line L3 and the fourth line L4 (such as materials, shapes, compositions and the like) can be understood, which is not repeated in the embodiments of the present disclosure.

Figure 5:
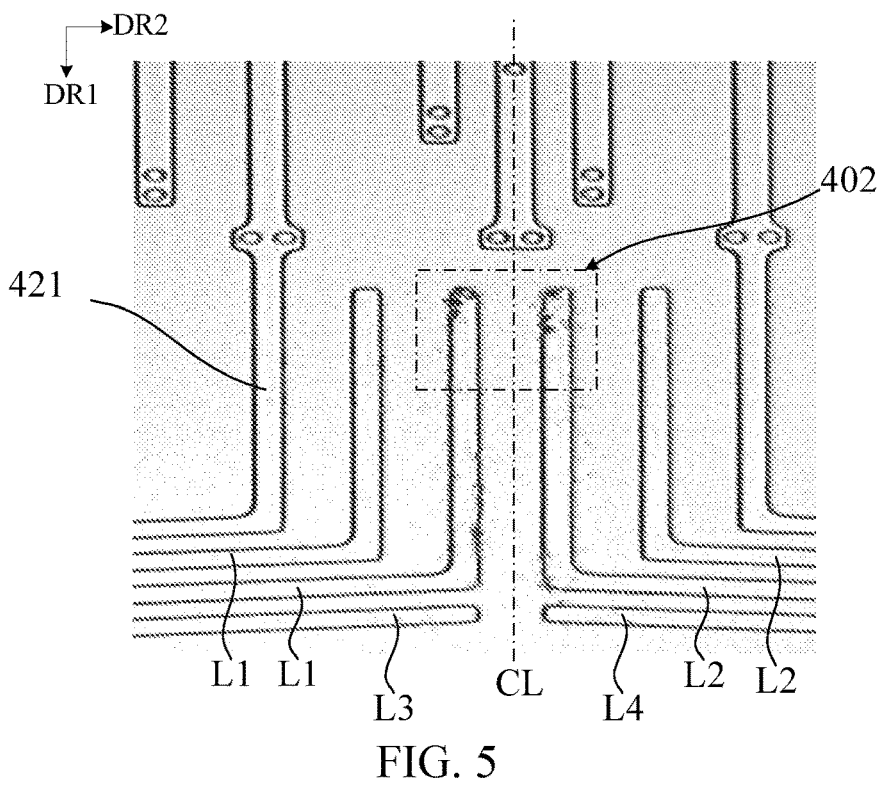
FIG. 5 is a schematic diagram of an electrostatic protection structure in a region 401 in the display substrate shown in FIG. 1.
Figure 6:
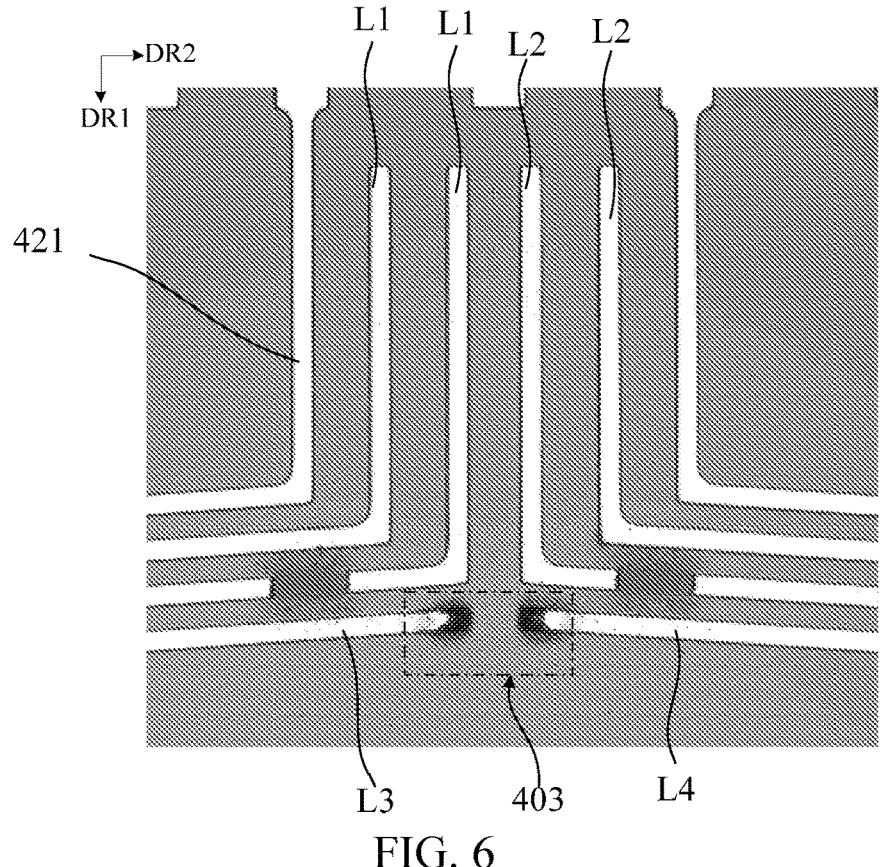
FIG. 6 is another schematic diagram of an electrostatic protection structure in the region 401 in the display substrate shown in FIG. 1.

FIG. 5 is a schematic diagram of an electrostatic protection structure in a region 401 in the display substrate shown in FIG. 1. FIG. 6 is another schematic diagram of an electrostatic protection structure in the region 401 in the display substrate shown in FIG. 1. The electrostatic protection structures in FIGS. 6 and 5 are formed with a same process.

In an exemplary embodiment, as shown in FIGS. 5 and 6, the region 401 may include an electrostatic protection structure and a plurality of fanout wires 421. The electrostatic protection structure may include two pairs of first electrostatic protection lines (L1, L2) and one pair of second electrostatic protection lines (L3, L4).

In an exemplary embodiment, as shown in FIG. 5, the fanout wires 421 may be connected to the display region (AA area) through a via hole.

As shown in FIG. 5, ESD breakdown occurs in a portion of one first pair of electrostatic protection lines (L1, L2) in a region 402 while no ESD breakdown occurs in other locations. As shown in FIG. 6, laser is used to cut off a second sub-line in one first pair of electrostatic protection lines (L1, L2) in advance to change a length of the second sub-line, and after a same process as that in FIG. 5 is used, ESD breakdown occurs in a portion of a second pair of electrostatic protection lines (L3, L4) in a region 403 while no ESD breakdown occurs in other locations still. As can be seen from FIGS. 5 and 6, ESD only occurs in the electrostatic protection structure. Therefore, electrostatic protection structures are strongly sensitive to ESD in a manufacturing process of display substrates, which can protect the display substrates from ESD. In this way, damage to the fanout wires 421 and devices connected to the fanout wires 421 in the display substrate can be effectively prevented, thereby improving the product yield of the display substrates.

Furthermore, in addition to the structures listed above, the display substrate in the embodiments of the present disclosure may include other necessary compositions and structures such as scanning signal lines, data signal lines and the like. Those skilled in the art can perform design and supplement accordingly according to the type of the display substrate, which will not be described here.

Figure 7:
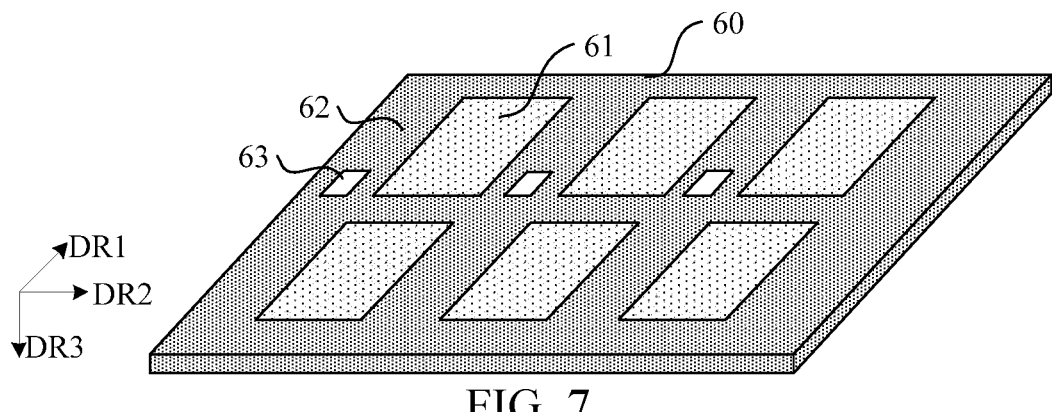
FIG. 7 illustrates schematically a structure of a display substrate motherboard in an exemplary embodiment of the present disclosure.

A display substrate motherboard is also provided in an embodiment of the disclosure. FIG. 7 illustrates schematically a structure of a display substrate motherboard in an exemplary embodiment of the present disclosure. As shown in FIG. 7, the display substrate motherboard may include a substrate 60 that may include a display substrate region and a non-display substrate region 62, wherein the display substrate region may include a plurality of display substrates 61, at least one of the plurality of display substrates 61 may be a display substrate in one or more of the above-described embodiments.

In an exemplary embodiment, the non-display substrate region 62 may include at least one third anti-static area 63 that may include at least one electrostatic protection structure, wherein the electrostatic protection structure may include at least one pair of electrostatic protection lines, and the pair of electrostatic protection lines may include two electrostatic protection lines disposed symmetrically about a center line extending in a first direction DR1. In this way, by disposing an electrostatic protection structure in a plurality of different regions in the display substrate motherboard, in a manufacturing process of the display substrate, ESD protection can be carried out in a plurality of regions, ESD-resistance of products can be optimized, ESD risk caused by the manufacturing process can be reduced, and electrostatic control requirements of equipment can be reduced, therefore the manufacturing yield of the display substrate can be improved.

In an exemplary embodiment, the substrate may be a glass substrate or the like. Here, no limitation is made thereto in embodiments of the present disclosure.

The above descriptions in embodiments of the display substrate motherboard are similar to the above descriptions in embodiments of the display substrate, and the embodiments of the display substrate motherboard have similar beneficial effects as the embodiments of the display substrate. Technical details of the display substrate motherboard undisclosed in the embodiments of the present disclosure may be understood by those skilled in the art with reference to the description of the display substrate in the embodiments of the present disclosure, which will not be repeated here.

A display apparatus is also provided in an embodiment of the present disclosure, which may include the display substrate in one or more embodiments above.

In an exemplary embodiment, the display apparatus may include, but is not limited to, an LCD device, an OLED display apparatus, etc. Here, no limitation is made thereto in embodiments of the present disclosure.

In an exemplary embodiment, the display apparatus may include, but is not limited to, any product or component having a display function such as a mobile phone, a tablet computer, a television, a display, a laptop computer, a digital photo frame, or a navigator. Here, there is no limitation on a type of the display apparatus in the embodiments of the present disclosure. Other essential components included in the display apparatus which should be understood to be included in the display apparatus by those of ordinary skill in the art will not be described repeatedly herein, and should not be taken as a limitation on the present disclosure.

The above descriptions in embodiments of the display apparatus are similar to the above descriptions in embodiments of the display substrate, and the embodiments of the display apparatus have similar beneficial effects as the embodiments of the display substrate. Technical details of the display apparatus undisclosed in the embodiments of the present disclosure may be understood by those skilled in the art with reference to the descriptions of the display substrate in the embodiments of the present disclosure, which will not be repeated here.

Although implementations of the present disclosure are disclosed above, the above contents are only implementations for easily understanding the present disclosure but not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display region and a bonding region located on a side of the display region, wherein the bonding region comprises a fanout region, the fanout region comprises a first anti-static area and a first wiring area encircling the first anti-static area, the first wiring area comprises a plurality of fanout wires, the first anti-static area comprises at least one electrostatic protection structure, the electrostatic protection structure is disposed between the plurality of fanout wires, and the electrostatic protection structure comprises at least one pair of electrostatic protection lines, and the pair of electrostatic protection lines comprises two electrostatic protection lines disposed symmetrically about a center line, the center line extends in a first direction.

2. The display substrate of claim 1, wherein an orthographic projection of the electrostatic protection structure on a plane of the display substrate and orthographic projections of the plurality of fanout wires on the plane of the display substrate are disposed at intervals.

3. The display substrate of claim 2, wherein the at least one pair of electrostatic protection lines comprises at least one of a first pair of electrostatic protection lines and a second pair of electrostatic protection lines, wherein the first pair of electrostatic protection lines comprises two L-shaped first electrostatic protection lines disposed symmetrically about the center line and the second pair of electrostatic protection lines comprises two line-shaped second electrostatic protection lines disposed symmetrically about the center line.

4. The display substrate of claim 1, wherein an interval distance between two electrostatic protection lines of the pair of electrostatic protection lines is less than 10 microns.

5. The display substrate of claim 4, wherein the at least one pair of electrostatic protection lines comprises at least one of a first pair of electrostatic protection lines and a second pair of electrostatic protection lines, wherein the first pair of electrostatic protection lines comprises two L-shaped first electrostatic protection lines disposed symmetrically about the center line and the second pair of electrostatic protection lines comprises two line-shaped second electrostatic protection lines disposed symmetrically about the center line.

6. The display substrate of claim 1, wherein the at least one pair of electrostatic protection lines comprises at least one of a first pair of electrostatic protection lines and a second pair of electrostatic protection lines, wherein the first pair of electrostatic protection lines comprises two L-shaped first electrostatic protection lines disposed symmetrically about the center line and the second pair of electrostatic protection lines comprises two line-shaped second electrostatic protection lines disposed symmetrically about the center line.

7. The display substrate of claim 6, wherein the first electrostatic protection line comprises a first sub-line extending in the first direction and a second sub-line extending in a second direction which are connected sequentially, there is a preset included angle between the second sub-line and the first sub-line, the preset included angle ranges from 80° to 100°, and the second direction intersects with the first direction.

8. The display substrate of claim 7, wherein a ratio between a length of the second sub-line and a length of the first sub-line is greater than or equal to 100, wherein the length of the second sub-line refers to a dimensional feature in the second direction, and the length of the first sub-line refers to a dimensional feature in the first direction.

9. The display substrate of claim 7, wherein a width of the second sub-line is equal to a width of the first sub-line, wherein the width of the second sub-line refers to a dimensional feature in the first direction, and the width of the first sub-line refers to a dimensional feature in the second direction.

10. The display substrate of claim 7, wherein the second sub-line comprises a first portion and a second portion that satisfy one or more of the following conditions: a material of the first portion is different from a material of the second portion, and a width of the first portion is different from a width of the second portion, wherein the width of the first portion and the width of the second portion refer to dimensional features in the first direction.

11. The display substrate of claim 7, wherein the second sub-line is a straight line or a curved line.

12. The display substrate of claim 11, wherein the curved line is serrated or wavy.

13. The display substrate of claim 1, wherein the bonding region further comprises a chip region located on a side of the fanout region in the first direction, wherein the chip region comprises a first pin area and a second pin area disposed sequentially along the first direction, the first pin area comprises a plurality of signal output pins disposed sequentially along a second direction, the second pin area comprises a plurality of signal input pins disposed sequentially along the second direction, and ends of at least part of the plurality of fanout wires away from the display region are connected to the plurality of signal output pins.

14. The display substrate of claim 1, further comprising a bezel region located on other sides, except the side where the bonding region is located, of the display region, wherein the bezel region comprises a second wiring area and a second anti-static area located on a side of the second wiring area away from the display region, the second wiring area comprises a ground wire disposed on a periphery of the display region, and the second anti-static area comprises at least one of the electrostatic protection structures disposed on a side of the ground wire away from the display region.

15. A display substrate motherboard, comprising a substrate, wherein the substrate comprises a display substrate region and a non-display substrate region, the display substrate area comprises a plurality of display substrates, at least one of the plurality of display substrates is the display substrate of claim 1.

16. The display substrate motherboard of claim 15, wherein the non-display substrate region comprises at least one third anti-static area, the third anti-static area comprises at least one electrostatic protection structure, the electrostatic protection structure comprises at least one pair of electrostatic protection lines, the pair of electrostatic protection lines comprises two electrostatic protection lines disposed symmetrically about a center line extending in a first direction.

17. A display apparatus, comprising the display substrate according to claim 1.

* * * * *